United States Patent
Feng et al.

(10) Patent No.: US 12,040,189 B2
(45) Date of Patent: Jul. 16, 2024

(54) METHOD OF REMOVING HARD MASK LAYER

(71) Applicant: United Semiconductor (Xiamen) Co., Ltd., Fujian (CN)

(72) Inventors: Sen Mao Feng, Fujian (CN); Ming Xuan Ren, Fujian (CN); Shih-Hsien Huang, Kaohsiung (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 224 days.

(21) Appl. No.: 17/715,008

(22) Filed: Apr. 6, 2022

(65) Prior Publication Data

US 2023/0317453 A1    Oct. 5, 2023

(30) Foreign Application Priority Data

Feb. 14, 2022   (CN) .......................... 202210132873.2

(51) Int. Cl.
  *H01L 21/033*    (2006.01)
  *H01L 21/3213*   (2006.01)
(52) U.S. Cl.
  CPC ...... *H01L 21/0337* (2013.01); *H01L 21/0332* (2013.01); *H01L 21/32139* (2013.01)
(58) Field of Classification Search
  CPC ............. H01L 21/0337; H01L 21/0332; H01L 21/32139
  See application file for complete search history.

(56) References Cited

U.S. PATENT DOCUMENTS

| | | | | |
|---|---|---|---|---|
| 11,335,568 B2* | 5/2022 | Wu | ...................... | H01L 21/0337 |
| 2016/0035580 A1* | 2/2016 | Cooper | ............. | H01L 21/31111 |
| | | | | 438/757 |
| 2020/0071614 A1* | 3/2020 | Kim | .................. | H01L 21/31111 |
| 2020/0251569 A1* | 8/2020 | Posseme | ............. | H01L 29/6653 |
| 2021/0066133 A1* | 3/2021 | Posseme | ......... | H01L 21/823468 |
| 2021/0108140 A1* | 4/2021 | Kim | ........................ | C09K 13/08 |
| 2021/0296136 A1* | 9/2021 | Bilodeau | ................ | C09K 13/00 |

OTHER PUBLICATIONS

Wikipedia "Parts per notation" via https://web.archive.org/web/20200321003311/https://en.wikipedia.org/wiki/Parts-per_notation ; pp. 1-8 (Year: 2020).*

* cited by examiner

*Primary Examiner* — Binh X Tran
(74) *Attorney, Agent, or Firm* — Winston Hsu

(57) ABSTRACT

A method of removing a hard mask layer includes providing a gate. A hard mask layer covers and contacts a top surface of the gate. Two spacer structures respectively contacts two sides of the gate. Two first spacers are respectively disposed on the two spacer structures. Later, a wet etching process is performed to remove the hard mask layer and the first spacers and keep the spacer structures. An etchant is utilized in the wet etching process. A selective etching ratio of the silicon nitride to silicon oxide of the etchant is more than 90. The etchant includes $Si(OH)_4$. A concentration of $Si(OH)_4$ is greater than or equal to 3.95 ppm and smaller than or equal to 10 ppm.

7 Claims, 4 Drawing Sheets

METHOD OF REMOVING HARD MASK LAYER

BACKGROUND OF THE INVENTION

1. Field of the Invention

The present invention relates to a method of removing a hard mask layer, and more particularly to a method of using an etchant having a selective etching ratio of silicon nitride to silicon oxide greater 90 to remove the hard mask layer.

2. Description of the Prior Art

In a conventional lithography process, a patterned photoresist is formed on a stacked material layer disposed on a substrate, and then an etching process is performed to transfer the pattern on the patterned photoresist to the stacked material layer.

However, as the integration of semiconductor devices continues to increase, to precisely transfer patterns with small dimensions and high aspect ratios is getting harder. The above-mentioned patterned photoresist may not be sufficient to cover the underlying stacked material layer during the etching process. Therefore, an additional hard mask layer is added between the patterned photoresist and the underlying stacked material layer to help transferring patterns.

Generally speaking, after the hard mask layer is no longer needed, it needs to be removed. However, when the hard mask layer is removed, the structure of the active area will be damaged.

SUMMARY OF THE INVENTION

In view of this, the present invention provides an etchant with a high etching selectivity to keep the integrity of an active region while removing the hard mask layer.

According to a preferred embodiment of the present invention, a method of removing a hard mask layer, includes providing a gate, a hard mask layer covering and contacting a top surface of the gate, two spacer structures respectively contacting two sides of the gate, two first spacers respectively disposed on the two spacer structures. Later, a wet etching process is performed to remove the hard mask layer and the two first spacers, wherein during the wet etching process, the two spacer structures remained. It is noteworthy that an etchant utilized during the wet etching process has a selective etching ratio of silicon nitride to silicon oxide which is greater 90, the etchant includes $Si(OH)_4$. A concentration of the $Si(OH)_4$ is greater than or equal to 3.95 ppm and smaller than or equal to 10 ppm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 depicts a method of removing a hard mask layer according to a preferred embodiment of the present invention, wherein:

FIG. 1 depicts a substrate with a hard mask layer thereon; and

FIG. 2 continues from FIG. 1.

DETAILED DESCRIPTION

Figure 1:
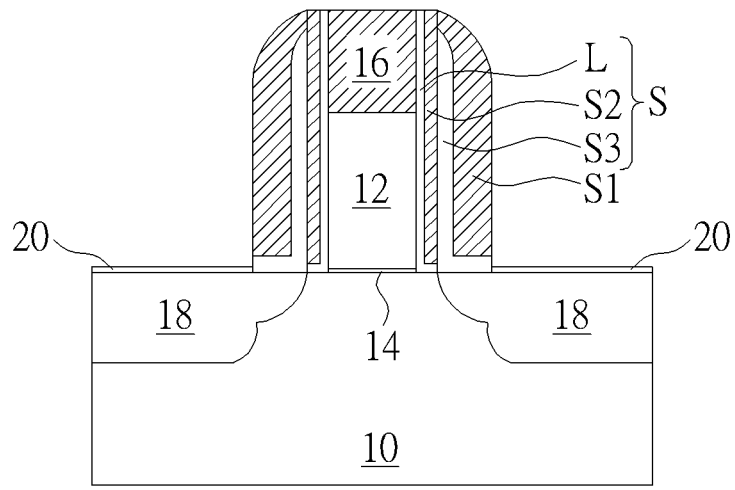
Figure 2:
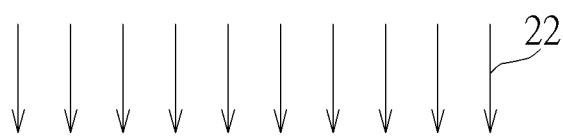
Figure 2:
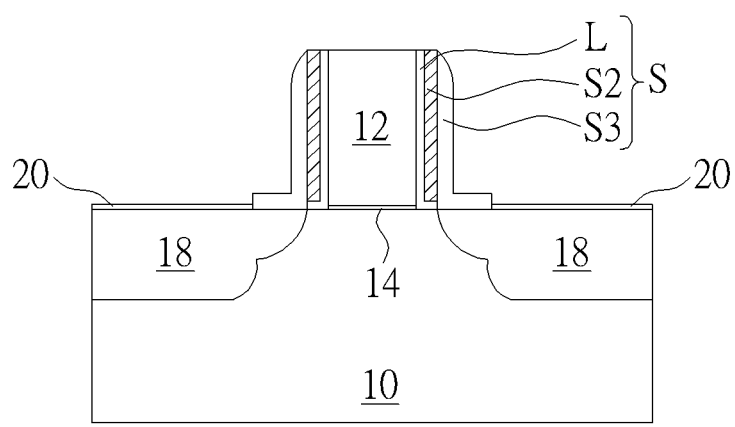

FIG. 1 to FIG. 2 depicts a method of removing a hard mask layer according to a preferred embodiment of the present invention.

As shown in FIG. 1, a substrate 10 is provided. A gate 12 is disposed on the substrate 10. A gate dielectric layer 14 is disposed between the gate 12 and the substrate 10. A hard mask layer 16 covers and contacts a top surface of the gate 12. Two spacer structures S respectively contact two sides of the gate 12 and two sides of the hard mask layer 16. Two first spacers S1 are respectively disposed on the spacer structures S. Each of the spacer structures S includes a liner L, a second spacer S2 and a third spacer S3. The liner L contacts the gate 12. The second spacer S2 contacts the liner L. The third spacer S3 contacts the second spacer S2. Two source/drain doping regions 18 are respectively disposed within the substrate 10 at two side of the gate 12. Two protective layers 20 are respectively contact and cover the source/drain doping regions 18. The protective layers 20 also cover other active regions (not shown) on the substrate 10. The hard mask layer 16, the first spacers S1, and the second spacers S2 are made of silicon nitride. The liners L, the third spacers S3 and the protective layers 20 are made of the silicon oxide.

As shown in FIG. 1 and FIG. 2, a wet etching process 22 is performed to remove the hard mask layer 16 and the two first spacers S1, wherein during the wet etching process 22, the two spacer structures S and the two protective layers 20 are remained. The etchant used in the wet etching process 22 includes phosphoric acid and water. In other words, the etchant includes phosphoric acid aqueous solution. According to a preferred embodiment of the present invention, during the wet etching process 22, the temperature of the etchant is greater than or equal to 150° C. and smaller than or equal to 160°C. The concentration of the phosphoric acid is greater than or equal to 83 wt % and smaller than or equal to 89 wt %. It is noteworthy that etchant utilized during the wet etching process 22 has a selective etching ratio of silicon nitride to silicon oxide which is greater 90. Furthermore, the etchant includes $Si(OH)_4$, and the concentration of the $Si(OH)_4$ is greater than or equal to 3.95 ppm and smaller than or equal to 10 ppm. Because the selective etching ratio of silicon nitride to silicon oxide is greater 90, the silicon nitride is a primary objective to be removed during the wet etching process 22. Therefore, the hard mask layer 16 can be entirely removed and the first spacers S1 are also removed while the protective layers 20 made of silicon oxide still covering the source/drain doping regions 18 and the active region. In this way, the source/drain doping regions 18 and the active region are not damaged by the etchant during the wet etching process. Now, a method of removing a hard mask layer of the present invention is completed.

The selective etching ratio of silicon nitride to silicon oxide of the etchant of the present invention is specially adjusted to become greater than 90 to prevent the protective layers 20 from being removed while removing the hard mask layer 16. The etchant which has elective etching ratio of silicon nitride to silicon oxide greater than 90 is produced by adding $Si(OH)_4$ with a first predetermined concentration into phosphoric acid aqueous solution with a second predetermined concentration. As shown in equation (1), $Si(OH)_4$ will split into $SiO_2$ and $H_2O$ in the phosphoric acid aqueous solution and equation (1) is reversible reaction. Therefore, as long as Si(OH)$_4$ remains at a first predetermined concentration in phosphoric acid aqueous solution, the concentration of SiO$_2$ in the phosphoric acid aqueous solution can be maintained at an expected level. In this way, the etching rate to silicon oxide in phosphoric acid aqueous solution can be decreased, and the selective etching ratio of silicon nitride to silicon oxide can be increased. Phosphoric acid serves as catalyst in equation (1).

$$Si(OH)_4 \leftrightarrows SiO_2 + 2H_2O \qquad (1)$$

Figure 3:
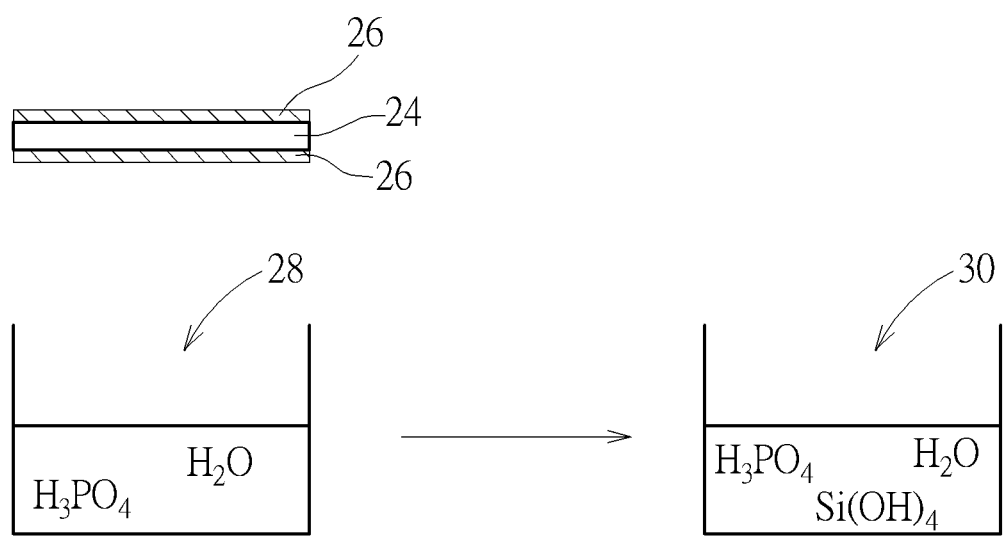
FIG. 3 depicts a producing method of an etchant.

Therefore, Si(OH)$_4$ in the etchant needs to be generated in the phosphoric acid aqueous solution. The steps of producing the etchant will be illustrated as follows. As shown in FIG. 3, numerous dummy wafers are provided. A dummy wafer 24 is shown in FIG. 3 as a representative of the dummy wafers. A front side and a back side of the dummy wafer 24 are covered by a silicon nitride layer 26. Next, the dummy wafer 24 is immersed the in the phosphoric acid aqueous solution 28 for a predetermined time. After the predetermined time, the phosphoric acid aqueous solution 28 becomes the etchant 30 of the present invention. Then, the dummy wafer 24 is taken out of the etchant 30. As shown in equation (2) and equation (3) as follows. When the silicon nitride layer 26 is immersed in the phosphoric acid aqueous solution 28, the silicon nitride layer 26 reacts with H$_2$O to generate SiO$_2$ and NH$_3$. Later, SiO$_2$ reacts with H$_2$O to generate Si(OH)$_4$. In equation (2) and equation (3), Phosphoric acid serves as catalyst.

$$Si_3N_4 + 12H_2O \rightarrow 3SiO_2 + 4NH_3 \qquad (2)$$

$$SiO_2 + 2H_2O \leftrightarrows Si(OH)_4 \qquad (3)$$

Therefore, the silicon nitride layer 26 on the dummy wafer 24 provides silicon nitride. Moreover, the thickness of the silicon nitride layer 26 and the total number of the dummy wafers are used to adjust the quantity of silicon nitride immersed in the phosphoric acid aqueous solution 28. The generated quantity of Si(OH)$_4$ is controlled by the predetermined time (the duration which the silicon nitride layer 26 immersed in the phosphoric acid aqueous solution 28). According to a preferred embodiment of the present invention, a thickness of the silicon nitride layer 26 on the front side is 3000 angstroms, and a thickness of the silicon nitride layer 26 on the back side is 3000 angstroms. The total number of the dummy wafers is 100. The predetermined time is between 300000 and 700000 seconds. By doing so, a concentration of Si(OH)$_4$ is greater than or equal to 3.95 ppm and smaller than or equal to 10 ppm. In this way, the selective etching ratio of silicon nitride to silicon oxide of the etchant 30 can be made to be greater 90.

Figure 4:
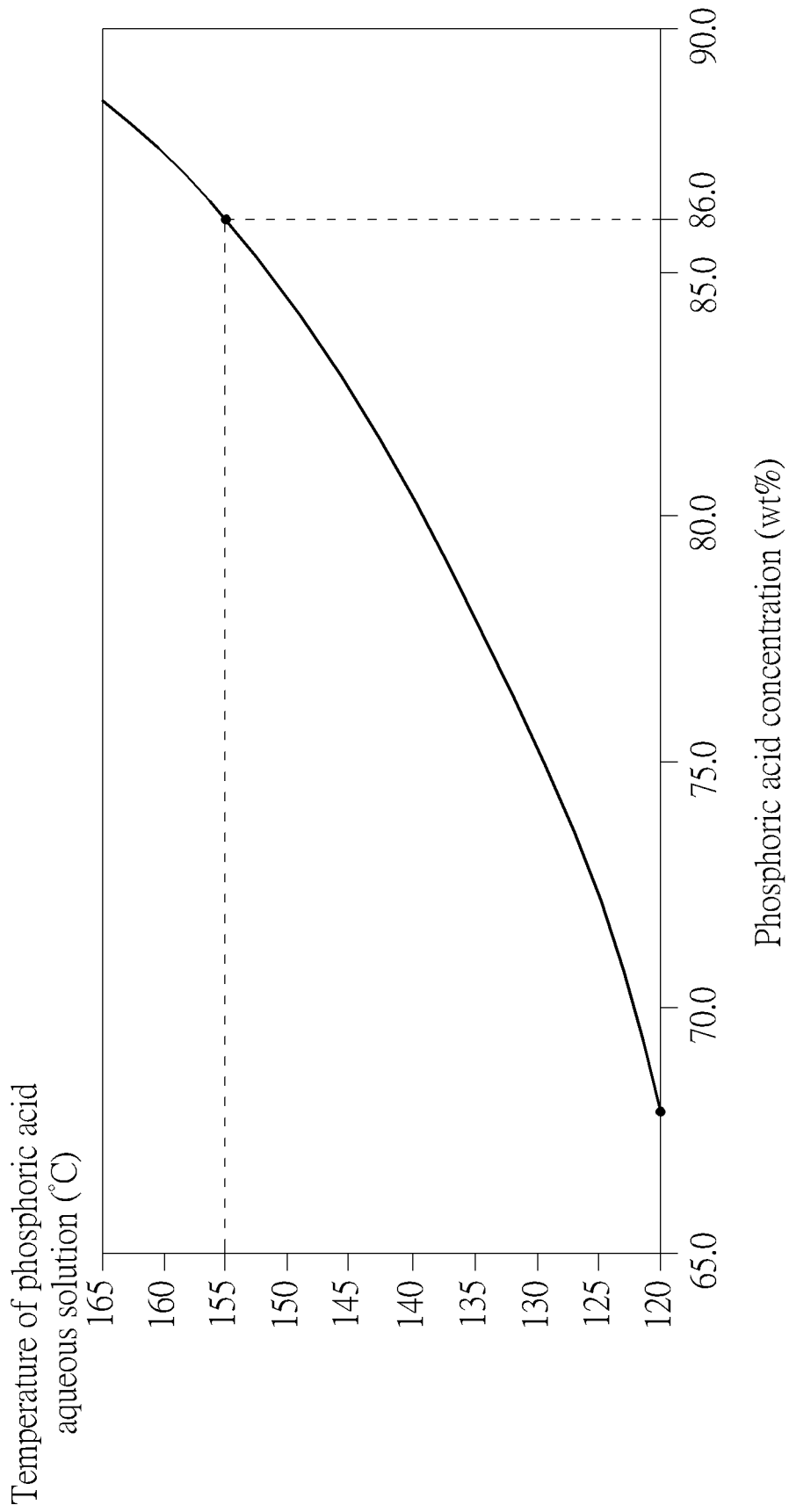
FIG. 4 depicts azeotropic points of phosphoric acid aqueous solution at different temperatures and different concentrations.

Moreover, the wet etching process is performed at an azeotropic point of phosphoric acid aqueous solution. FIG. 4 depicts azeotropic points of phosphoric acid aqueous solution at different temperatures and different concentrations. As shown in FIG. 4, during the wet etching process, the best concentration of phosphoric acid in the etchant is 86 wt %, and the best temperature of the phosphoric acid aqueous solution is 155° C., and under this condition, the phosphoric acid aqueous solution is at an azeotrope point. However, before performing steps of producing the etchant illustrated in FIG. 3, the selective etching ratio of silicon nitride to silicon oxide of the phosphoric acid aqueous solution at the azeotrope point is smaller than 35. After performing steps of producing the etchant illustrated in FIG. 3 by adding Si(OH)$_4$ which has a concentration greater than or equal to 3.95 ppm and smaller than or equal to 10 ppm in to phosphoric acid aqueous solution, the selective etching ratio of silicon nitride to silicon oxide of phosphoric acid aqueous solution can be increased to 90. Then, phosphoric acid aqueous solution can serve as the etchant of the present invention. A certain tolerance is acceptable in the temperature and concentration of the etchant during the wet etching process. According to a preferred embodiment of the present invention, the concentration of phosphoric acid is greater than or equal to 83 wt % and smaller than or equal to 89 wt %. The temperature of the etchant is greater than or equal to 150° C. and smaller than or equal to 160°C. Under these conditions, the selective etching ratio of silicon nitride to silicon oxide can be greater 90.

However, the concentration of phosphoric acid in the etchant and the temperature of the etchant can be altered based on different conditions. The concentration and the temperature are better to choose the concentration and the temperature at an azeotropic point. Furthermore, the concentration of Si(OH)$_4$ can also be varied along with the concentration and the temperature of phosphoric acid. However, as long as to increase the selective etching ratio of silicon nitride to silicon oxide by adding Si(OH)$_4$ into phosphoric acid aqueous solution is in the claimed field of the present invention.

Figure 5:
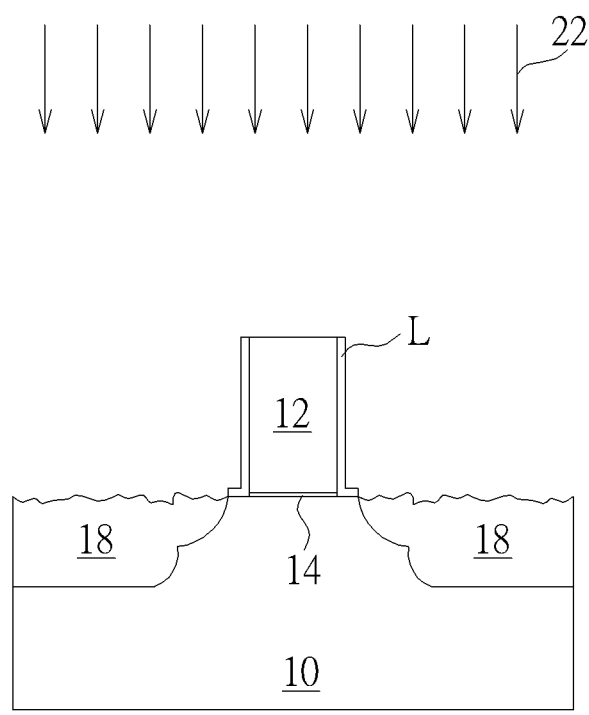
FIG. 5 depicts a method of removing a hard mask layer according to an example of the present invention.

FIG. 5 depicts a method of removing a hard mask layer according to an example of the present invention, wherein elements which are substantially the same as those in FIG. 1 are denoted by the same reference numerals; an accompanying explanation is therefore omitted.

As shown in FIG. 5, the etchant has the selective etching ratio of silicon nitride to silicon oxide which is smaller than 35, therefore, the protective layers 20 on the source/drain doping regions 18 are removed during the wet etching process 22, and the surfaces of the source/drain doping regions 18 are damaged.

A selective etching ratio of silicon nitride to silicon oxide of the etchant of the present invention is increased to become greater than 90 by adding Si(OH)$_4$ into phosphoric acid aqueous solution. In this way, the hard mask layer can be removed while the silicon oxide layer can be remained. Therefore, the source/drain doping regions and other active regions covered by the silicon oxide layer will not be damaged during the wet etching process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of removing a hard mask layer, comprising:
   providing a gate, a hard mask layer covering and contacting a top surface of the gate, two spacer structures respectively contacting two sides of the gate, two first spacers respectively disposed on the two spacer structures, wherein the two first spacers and the hard mask layer are made of silicon nitride, and the two spacer structures are made of silicon oxide; and
   performing a wet etching process to remove the hard mask layer and the two first spacers, wherein during the wet etching process, the two spacer structures remained; wherein an etchant utilized during the wet etching process has a selective etching ratio of silicon nitride to silicon oxide which is greater 90, the etchant comprises Si(OH)$_4$, a concentration of the Si(OH)$_4$ is greater than or equal to 3.95 ppm by mole fraction and smaller than or equal to 10 ppm by mole fraction.

2. The method of removing a hard mask layer of claim 1, wherein the etchant comprises phosphoric acid and water, a concentration of the phosphoric acid is greater than or equal to 83 wt % and smaller than or equal to 89 wt %.

3. The method of removing a hard mask layer of claim 2, wherein a method of producing the etchant comprises:
provide a plurality of dummy wafers, wherein a front side and a back side of each of the dummy wafers are respectively covered by a silicon nitride layer;
immersing the dummy wafers in the etchant by a predetermined time; and
after the predetermined time, taking the dummy wafers out of the etchant.

4. The method of removing a hard mask layer of claim 3, wherein a thickness of the silicon nitride layer is 3000 angstroms, and the predetermined time is between 300000 and 700000 seconds.

5. The method of removing a hard mask layer of claim 3, wherein before immersing the dummy wafers in the etchant, the etchant has the selective etching ratio of silicon nitride to silicon oxide which is smaller than 35, after immersing the dummy wafers in the etchant, the etchant has the selective etching ratio of silicon nitride to silicon oxide which is greater 90.

6. The method of removing a hard mask layer of claim 3, wherein $Si(OH)_4$ is generated by immersing the dummy wafers in the etchant.

7. The method of removing a hard mask layer of claim 1, wherein during the wet etching process, a temperature of the etchant is greater than or equal to 150° C. and smaller than or equal to 160° C.

* * * * *